(12) United States Patent
Fudeta et al.

(10) Patent No.: US 6,887,311 B2
(45) Date of Patent: May 3, 2005

(54) METHOD OF FORMING OHMIC ELECTRODE

(75) Inventors: Mayuko Fudeta, Mihara (JP); Toshio Hata, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 86 days.

(21) Appl. No.: 10/283,371

(22) Filed: Oct. 30, 2002

(65) Prior Publication Data

US 2003/0104705 A1 Jun. 5, 2003

(30) Foreign Application Priority Data

Oct. 31, 2001 (JP) ........................................ 2001-334897

(51) Int. Cl.[7] ................................................. C30B 1/10
(52) U.S. Cl. ..................... 117/3; 117/4; 117/7; 117/8; 117/9
(58) Field of Search ................. 117/3, 4, 7, 8, 117/9

(56) References Cited

U.S. PATENT DOCUMENTS 4,141,020 A * 2/1979 Howard et al. ............. 257/486
4,310,568 A * 1/1982 Howard et al. ............. 438/570

FOREIGN PATENT DOCUMENTS

| EP | 0650201 | * | 4/1995 |
| JP | 7-045867 | | 2/1995 |
| JP | 2001-15452 | * | 1/2001 |

OTHER PUBLICATIONS

Terano et al.; "Study of Hf–Based Ohmic Electrode for N–Type GaN"; Proceedings of the 60th Annual Meeting of the Japan Society of Applied Physics, p. 302, Sep. 1999.

* cited by examiner

Primary Examiner—Robert Kunemund
(74) Attorney, Agent, or Firm—Nixon & Vanderhye P.C.

(57) ABSTRACT

There is provided a method of forming an ohmic electrode, including the steps of: forming a hafnium layer on a surface of an n type nitride-based compound semiconductor layer to have a thickness of 1 to 15 nm; forming an aluminum layer on the hafnium layer; and annealing the hafnium layer and the aluminum layer to form a layer formed of hafnium and aluminum mixed together.

3 Claims, 7 Drawing Sheets

<1-100> DIRECTION

METHOD OF FORMING OHMIC ELECTRODE

BACKGROUND OF THE INVENTION

1. Field of the Invention

The present invention relates generally to methods of forming an ohmic electrode formed on an n type nitride-based compound semiconductor layer, and particularly to methods of forming an ohmic electrode having low resistance, hardly peeling off, and providing good ohmic contact.

2. Description of the Background Art

It has conventionally been known that a nitride-based compound semiconductor represented for example by $In_xGa_yAl_{1-x-y}N$ can be used as a blue light emitting device, wherein $0 \leq x \leq 1$, $0 \leq y \leq 1$ and $x+y \leq 1$, and in recent years blue light emitting diodes, violet semiconductor lasers and the like are being studied. These light emitting diodes and semiconductor lasers need to externally receive a current. Accordingly, the material(s) of an ohmic electrode provided thereto and the technique used to form the same are significantly important.

A typical ohmic electrode formed on an n type nitride-based compound semiconductor layer is disclosed for example in Japanese Patent Laying-Open No. 7-45867. It is an ohmic electrode formed of a titanium (Ta) layer and an aluminum (Al) layer stacked and then annealed (hereinafter referred to as a "Ti/Al electrode"). Furthermore in the proceedings of the 60th annual meeting of the Japan Society of Applied Physics, page 302 (Lecture No. 3P-W-14) there is a report of an ohmic electrode superior in thermal stability to the Ti/Al electrode and allowed of being annealed in a wider temperature range of 400 to 600 degrees centigrade. According to the report, the ohmic electrode is formed of a hafnium (Hf) layer formed on an n type nitride-based compound semiconductor layer and an Al layer stacked thereon (hereinafter referred to as a "Hf/Al electrode").

The above reported Hf/Al electrode, however, is formed by stacking Hf and Al layers without particularly controlling the concentrations of Hf and Al contained in the electrode. The Hf/Al electrode thus fabricated has a significantly rough surface and provides poor contact with the n type nitride-based compound semiconductor layer so that it may have high resistance. Furthermore, the electrode can peel off the semiconductor layer and thus fail to provide good ohmic contact.

SUMMARY OF THE INVENTION

In view of the above circumstances the present invention contemplates a method of forming an ohmic electrode having low resistance, hardly peeling off an n type nitride-based compound semiconductor layer, and providing good ohmic contact.

The present invention provides a method of forming an ohmic electrode including the steps of: forming a hafnium layer on a surface of an n type nitride-based compound semiconductor layer to have a thickness of 1 to 15 nm; forming an aluminum layer on the hafnium layer; and annealing the hafnium layer and the aluminum layer to form a layer formed of hafnium and aluminum mixed together. Note that in the present specification, "%" represents "% by mass".

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention provides an ohmic electrode characterized in that it has a Hf content of no less than 0.001% to no more than 50% and an Al content of no less than 50% to no more than 99.999% in a layer in a vicinity of an interface between an n type nitride-based compound semiconductor layer and the ohmic electrode. This has been found by the present inventors from a result of the following resistance measurement and energization test;

Measurement of Resistance

Figure 1:
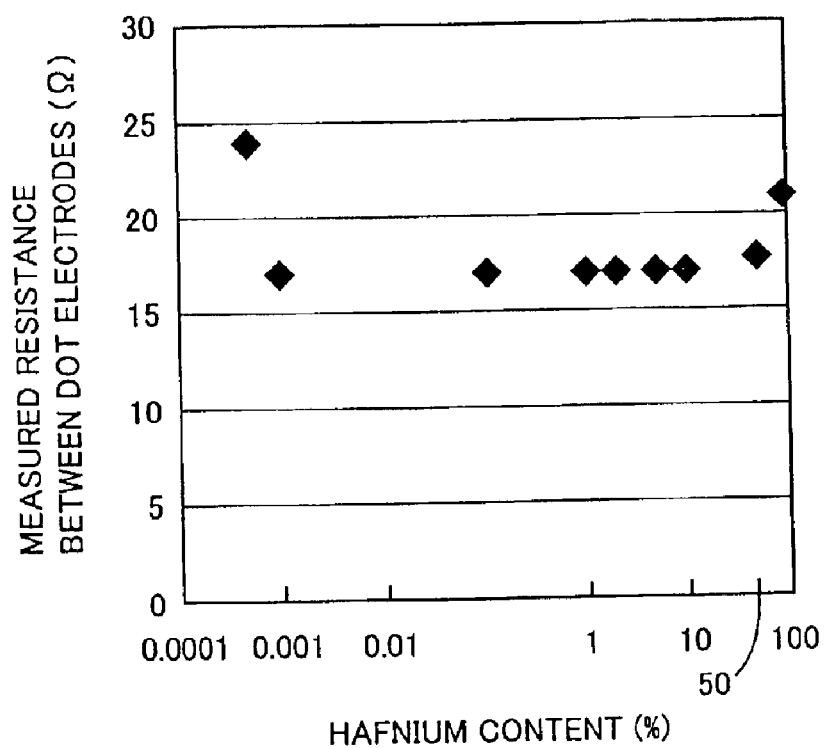
FIG. 1 represents a relationship between Hf content and resistance in a vicinity of an interface between an n type nitride-based compound semiconductor layer and a layer formed of Hf and Al mixed together.

An ohmic electrode formed of Al and Hf was fabricated on a surface of an n type GaN semiconductor. FIG. 1 represents a relationship between Hf content and resistance in a vicinity of an interface between the n type nitride-based compound semiconductor layer and the ohmic electrode. In FIG. 1 the horizontal axis represents Hf content (in % by mass) and the vertical axis represents resistance (in $\Omega$).

(i) Preparation of Samples

Dot electrodes formed of ohmic electrodes spaced by 500 $\mu$m and arranged on a surface of a Si doped n type GaN semiconductor were provided as samples. The ohmic electrodes were formed by vapor-depositing a Hf layer on a Si doped n type GaN semiconductor and an Al layer to have a thickness of 150 nm on the Hf layer and then annealing the same at 500 degrees centigrade for three minutes. For each sample the Hf layer was changed in thickness from 0.5 to 150 nm to allow a Hf content ranging from less than 0.001% to more than 90% in a vicinity of an interface between the n type nitride-based compound semiconductor layer and the ohmic electrode.

(ii) Method of Measurement of Resistance

Resistance was calculated from a graph obtained by increasing a voltage until a current of 50 mA flows between adjacent dot electrodes of each sample.

(iii) Result of Measurement

As shown in FIG. 1, a sample with a Hf content less than 0.001% in the vicinity of the interface provided high resistance. Furthermore, a sample with a Hf content larger than 50% in the vicinity of the interface also provided high resistance. In these cases, some interfaces between the n type nitride-based compound semiconductor layer and the dot electrodes fail to provide sufficient ohmic contact.

Furthermore, samples with a Hf content of no less than 0.001% to no more than 50% in the the vicinity of the interface were free of variation in resistance and had low resistance between any two dot electorodes.

Note that the above Hf content measurements were provided using secondary ion-mass spectrography (SIMS), electron probe microanalyzer (EPMA), or the like.

Energization Test (i) Samples

A light emitting nitride-based compound semiconductor device having an ohmic electrode with a Hf content less than 0.001% in a vicinity of an interface between an n type nitride-based compound semiconductor layer and the ohmic electrode, and a light emitting nitride-based compound semiconductor device having an ohmic electrode with a Hf content larger than 50% and an Al content smaller than 50% in the vicinity of the interface were provided as samples.

(ii) Procedure of Energization Test

In the atmosphere the samples were energized with a current of 30 mA for 5,000 hours and meanwhile each ohmic electrode's surface condition and peel-off and each sample's light emission and the like were observed.

(iii) Test Result

The sample with the Hf content less than 0.001% degraded early and lost ohmic contact, and for example peeled off and was impaired in reliability.

The sample with the Hf content larger than 50% and the Al content smaller than 50% had an insufficiently contacting portion in the interface between the n type nitride-based compound semiconductor layer and the ohmic electrode, and the ohmic electrode had a significantly rough surface. Thus the sample was impaired in reliability.

From these results it has been found that it is preferable that an ohmic electrode formed on a surface of an n type nitride-based compound semiconductor layer has a Hf content of no less than 0.001% to no more than 50% and an Al content of no less than 50% to no more than 99.999% in a vicinity of an interface between the n type nitride-based compound semiconductor layer and the ohmic electrode. This is because it is believed that to obtain good contact between an ohmic electrode and an n type nitride-based compound semiconductor layer the electrode is required to have a certain amount of Hf and that of Al in contact with the semiconductor layer.

Furthermore it has also been found that the ohmic electrode's Hf and Al contents can be controlled to fall within the above range readily by forming a Hf layer on a surface of an n type nitride-based compound semiconductor layer to have a thickness of 1 to 15 nm and forming an aluminum layer thereon.

EXAMPLES

Hereinafter examples are used to more specifically describe a light emitting nitride-based compound semiconductor device using an ohmic electrode of the present invention.

First Example

Figure 2:
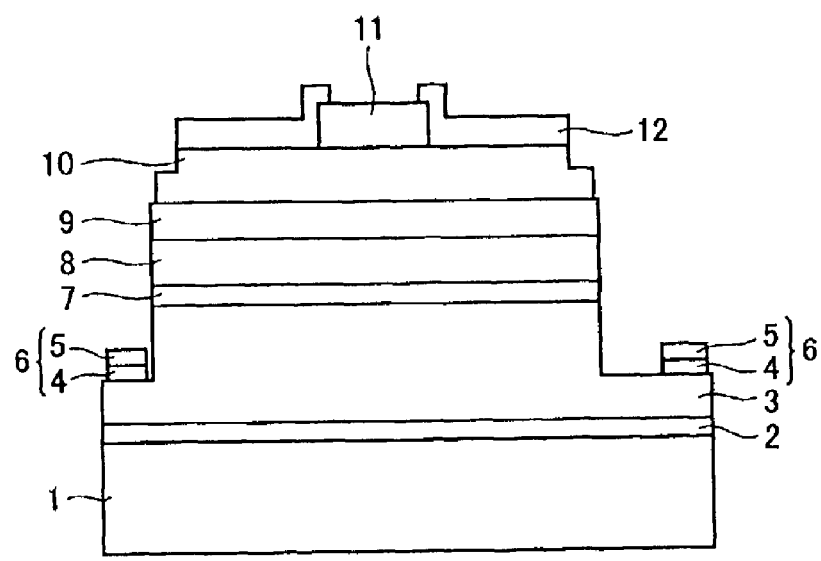
FIG. 2 is a schematic cross section of a light emitting nitride-based compound semiconductor device of a first example.

With reference to FIG. 2, a first example provides a light emitting nitride-based compound semiconductor device including a sapphire substrate 1, a buffer layer 2, an n type nitride-based compound semiconductor layer 3, an ohmic electrode 4, a pad electrode 5, an n type electrode 6, a light emitting layer 7, a p type clad layer 8, a p type contact layer 9, a p type ohmic electrode 10, a p type pad electrode 11, and a transparent conductive film 12.

The light emitting nitride-based compound semiconductor device of the first example is fabricated, as specifically described hereinafter.

On sapphire substrate 1 buffer layer 2 is formed and thereon n type nitride-based compound semiconductor layer 3 is formed of silicon (Si) doped GaN. Then on semiconductor layer 3 multiple quantum well light emitting layer 7 is formed of a barrier layer formed of GaN and a well layer formed of InGaN. On light emitting layer 7 p type clad layer 8 is formed of Mg doped AlGaN. On clad layer 8 p type contact layer 9 is formed of Mg doped GaN. On p type contact layer 9 p type transparent ohmic electrode 10 is formed of a palladium (Pd) layer of 7 nm in thickness by vapor deposition.

On p type ohmic electrode 10 p type pad electrode 11 is formed of a Pd layer of 15 nm in thickness and a gold (Au) layer of 500 nm in thickness formed thereon. P type pad electrode 11 is formed by vapor deposition using a metal mask.

A light emitting region is then formed. More specifically, photoresist is applied on p type ohmic electrode 10 and p type pad electrode 11, and p type ohmic electrode 10 at the photoresist-free portion is etched away with a hydrochloric acid based etchant to form a light emitting pattern. Thereafter the photoresist is removed.

Transparent conductive film 12 of Sn doped $In_2O_3$ (ITO) is formed to cover a portion of p type pad electrode 11 and a surface of p type ohmic electrode 10 by sputtering. And a portion of transparent conductive film 12 is etched away with a ferric chloride based solution.

Then, photoresist is used as a mask for dry-etching and reactive ion etching (RIE) is employed to etch the intermediate product to expose a surface of semiconductor layer 3.

Ohmic electrode 4 is then formed by lift-off. More specifically, photoresist is uniformly applied on the exposed semiconductor layer 3 and at a portion to be provided with ohmic electrode 4 the photoresist is removed to provide a window.

Then ohmic electrode 4 including a Hf layer of 5 nm thickness and an Al layer of 150 nm thickness formed on the Hf layer is formed by lift-off to have a width of 10 $\mu$m on the exposed surface of semiconductor layer 3.

The Hf layer and the Al layer are then annealed in a vacuum at 500 degrees centigrade for three minutes to form a region of a mixture of Hf and Al in a vicinity of an interface of ohmic electrode 4 and semiconductor layer 3.

Figure 3:
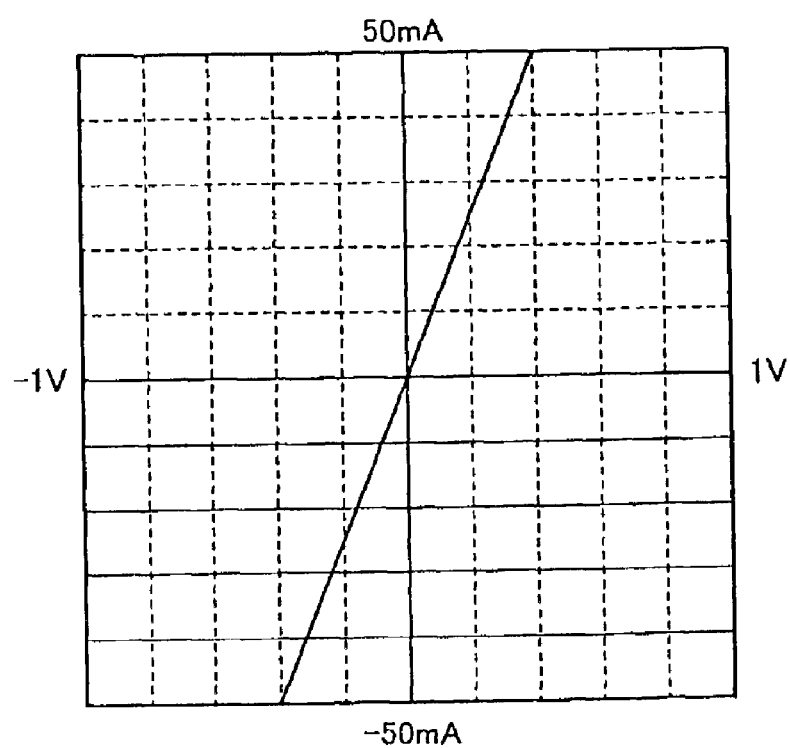
FIG. 3 represents a result of measuring current-voltage characteristics between ohmic electrodes provided in the light emitting nitride-based compound semiconductor device of the first example.

FIG. 3 represents a result of measuring current-voltage characteristics between ohmic electrodes 4 of the light emitting nitride-based compound semiconductor device of the first example to confirm ohmic contact. It has been found that good ohmic contact was obtained.

Hf and Al are mixed together in a vicinity of an interface of ohmic electrode 4 and semiconductor layer 3, as has been described above, and it has been found that a vicinity of an interface between n type nitride-based compound semiconductor layer 3 and ohmic electrode 4 contains Hf of approximately 0.5% and Al of approximately 99.5% in amount.

Non-ohmic pad electrode 5 formed of a Pd layer having a thickness of 15 nm and an Al layer formed on the Pd layer and having a thickness of 500 nm is then formed on ohmic electrode 4 by vapor deposition to form n type electrode 6. Pad electrode 5 that is non-ohmic allows a current to be efficiently introduced so that a low voltage driven, light emitting nitride-based compound semiconductor device can be fabricated.

Then, substrate 1 is ground and polished to have a thickness of approximately 100 µm and divided into squares of 350 µm×350 µm and an Au wire (not shown) is bonded to p type pad electrode 11 and pad electrode 5 to complete a light emitting nitride-based compound semiconductor device.

Figure 4:
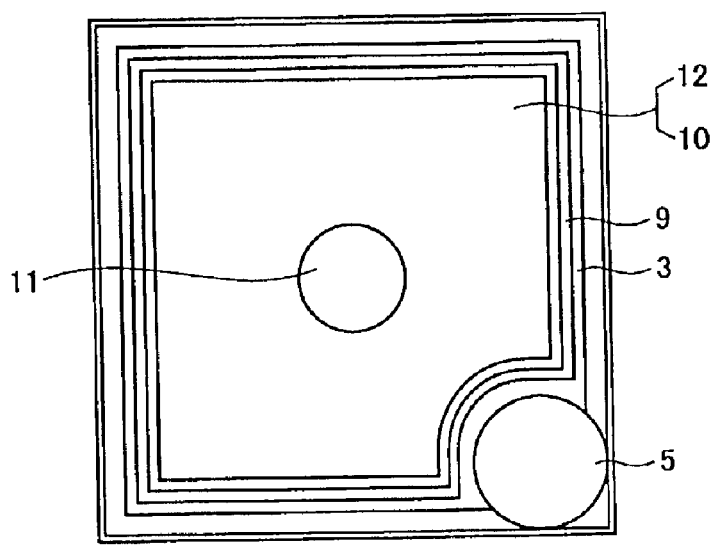
FIG. 4 is a schematic top view of the light emitting nitride-based compound semiconductor device of the first example.

FIG. 4 is a schematic top view of the light emitting nitride-based compound semiconductor device thus fabricated.

Furthermore the light emitting nitride-based compound semiconductor device thus fabricated can be driven with a voltage of 3.0 V. A low voltage driven, light emitting nitride-based compound semiconductor device can thus be fabricated.

Furthermore, this light emitting device was subjected to an energization test and after a period of 10,000 hours had elapsed the device did not have an electrode for example peeling off and it has been found to have high reliability.

While n type nitride-based compound semiconductor layer 3 has been formed of Si doped GaN, it may be formed for example of Si doped InGaN.

Furthermore, while ohmic electrode 4 has been formed by initially forming a Hf layer on semiconductor layer 3 and then forming an Al layer thereon, it may be formed by initially forming an Al layer on semiconductor layer 3 and then forming a Hf layer thereon.

Second Example

In the first example, Hf and Al layers are provided by vapor deposition and then annealed in a vacuum to form an ohmic electrode with the Hf and Al layers mixed together. In a second example, in depositing a Hf layer or an Al layer a wafer is heated to form an ohmic electrode having a layer with Hf and Al mixed together.

Figure 5:
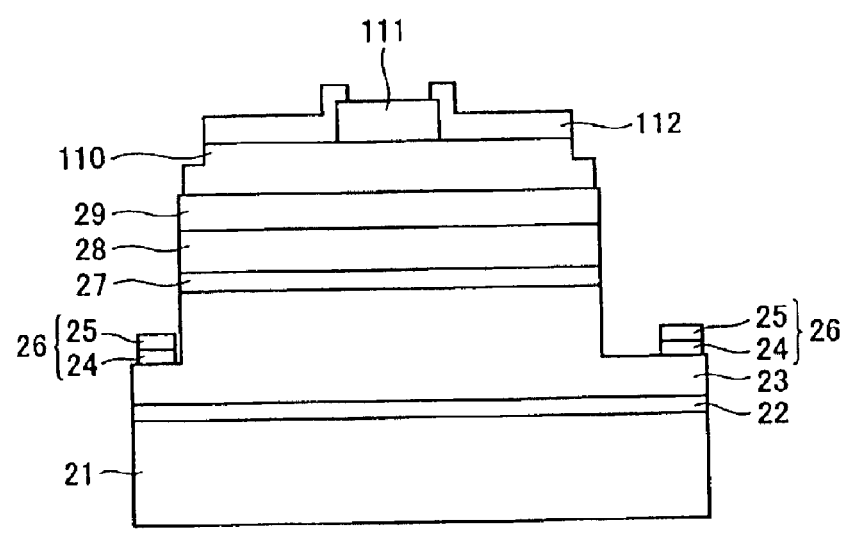
FIG. 5 is a schematic cross section of the light emitting nitride-based compound semiconductor device of the second example.

With reference to FIG. 5, the second example provides a light emitting nitride-based compound semiconductor device including a sapphire substrate 21, a buffer layer 22, an n type nitride-based compound semiconductor layer 23, an ohmic electrode 24, a pad electrode 25, an n type electrode 26, a light emitting layer 27, a p type clad layer 28, a p type contact layer 29, a p type ohmic electrode 110, a p type pad electrode 111, and a transparent conductive film 112

The light emitting nitride-based compound semiconductor device of the second example is fabricated, as specifically described hereinafter.

The same process as described in the first example is followed until the intermediate product is dry-etched to expose a surface of semiconductor layer 23.

Ohmic electrode 24 is then formed by lift-off. More specifically, photoresist is uniformly applied on the exposed semiconductor layer 23 and at a portion to be provided with ohmic electrode 24 the photoresist is removed to provide a window.

Then prior to vapor deposition a wafer is heated to 80 degrees centigrade. With the wafer held at 80 degrees centigrade, a Hf layer is deposited to have a thickness of 3 nm and thereon an Al layer is deposited to have a thickness of 150 nm and lift-off is employed to form the same on the exposed surface of semiconductor layer 23 to have a width of 10 µm to form ohmic electrode 24.

Current-voltage characteristic between ohmic electrodes 24 was measured and it was similar to that of the first example. It has been found that heating a wafer during vapor deposition can eliminate the necessity of annealing, as described in the first example, to provide an ohmic electrode of low resistance.

In a vicinity of an interface of ohmic electrode 24 and semiconductor layer 23 Hf and Al are mixed together and it has been found that a vicinity of the interface between semiconductor layer 23 and ohmic electrode 24 contains Hf of approximately 0.5% and Al of approximately 99.5% in amount.

The step of forming non-ohmic pad electrode 25 and the subsequent steps are similar to those of the first example.

Furthermore the light emitting nitride-based compound semiconductor device thus fabricated can be driven with a voltage of 3.0 V. A low voltage driven, light emitting nitride-based compound semiconductor device can thus be fabricated.

Furthermore, this light emitting device was subjected to an energization test and after a period of 10,000 hours had elapsed the device did not have an electrode for example peeling off and it has been found to have high reliability.

Furthermore, while ohmic electrode 24 has been formed by initially forming a Hf layer on semiconductor layer 23 and then forming an Al layer thereon, it may be formed by initially forming an Al layer on semiconductor layer 23 and then forming a Hf layer thereon.

Third Example

Figure 6:
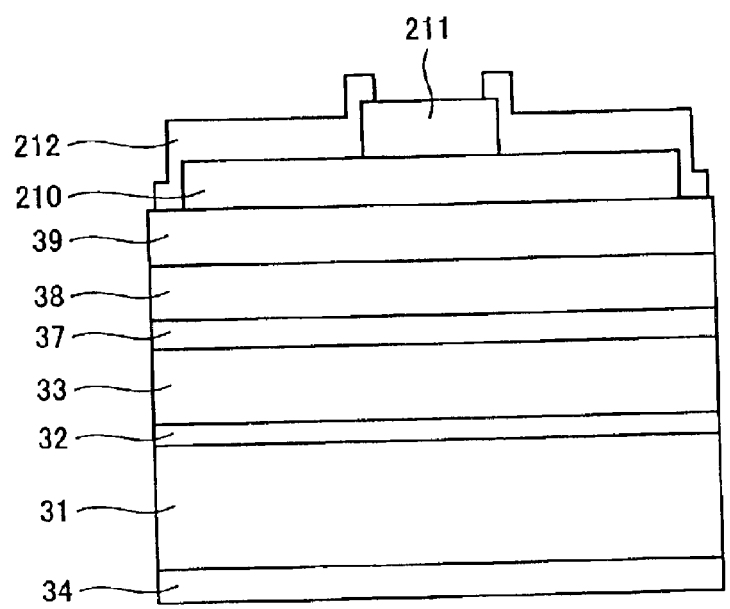
FIG. 6 is a schematic cross section of a light emitting nitride-based compound semiconductor device of a third example.

With reference to FIG. 6 a third example provides a light emitting nitride-based compound semiconductor device including an ohmic electrode 34, a substrate 31, a buffer layer 32, an n type nitride-based compound semiconductor layer 33, a light emitting layer 37, a p type clad layer 38, a p type contact layer 39, a p type ohmic electrode 210, a p type pad electrode 211, and a transparent conductive film 212.

The light emitting nitride-based compound semiconductor device of the third example is fabricated, as specifically described hereinafter.

On n-type GaN sapphire substrate 31, buffer layer 32 and n type nitride-based compound semiconductor layer 33 of silicon (Si) doped GaN are formed in this order. Thereon multiple quantum well light emitting layer 37 is formed of a barrier layer formed of GaN and a well layer formed of InGaN. On light emitting layer 37 p type clad layer 38 is formed of p-type AlGaN. On clad layer 38 p type contact layer 39 is formed of p-type GaN. On a surface of p type contact layer 39 p type transparent ohmic electrode 210 is formed of a palladium (Pd) layer of 6 nm in thickness by vapor deposition. P type ohmic electrode 210 is annealed in a vacuum at 500 degrees centigrade for three minutes to process p type contact layer 39 and the p type ohmic electrode 210 to provide an alloy thereof.

Then on p-type ohmic electrode 210 photoresist is applied and the photoresist of a determined region is removed. P type ohmic electrode 210 at the photoresist-free portion is etched away with a hydrochloric acid based etchant. Thereafter the photoresist is removed.

On a portion of p type ohmic electrode 210 p type bonding pad electrode 211 is formed. More specifically, photoresist is applied uniformly on p type ohmic electrode 210 and p type contact layer 39, and at a portion to be provided with p type pad electrode 211 the photoresist is removed to provide a window. A stack formed of a Pd layer and an Au layer on the Pd layer is formed by vapor deposition to have a thickness of approximately 1 µm on the exposed p type ohmic electrode 210 and lift-off is employed to remove the stack on the photoresist to form p type pad electrode 211. After p type pad electrode 211 is formed, transparent conductive film 212 of ITO is formed to have a thickness of 100 nm on p type ohmic electrode 210 and a portion of p type pad electrode 211 by sputtering at a substrate temprature of 250 degrees centigrade.

Then, photoresist is applied on transparent conductive film 212 and from a predetermined region the photoresist is removed and transparent conductive film 212 located at the photoresist-free portion is etched away with a ferric chloride based solution. Thereafter the photoresist is removed.

Note that transparent conductive film 212 is so etched away except a portion thereof continuously covering an end of a top surface of p type pad electrode 211, a side surface of p type ohmic electrode 210, and a portion of an exposed portion of p contact layer 39 adjacent to p type ohmic electrode 210.

Then on a back surface of substrate 31 a Hf layer of 5 nm in thickness is provided by vapor deposition and thereon an Al layer of 200 nm in thickness is provided by vapor deposition and they are annealed in a vacuum at 500 degrees centigrade for three minutes to form ohmic electrode 34.

Ohmic electrode 34 and the back surface of substrate 31 has an interface with Hf and Al mixed together therearound and it has been found that a vicinity of an interface between substrate 31 and ohmic electrode 34 contains Hf of approximately 1% and Al of approximately 99% in amount.

Figure 7:
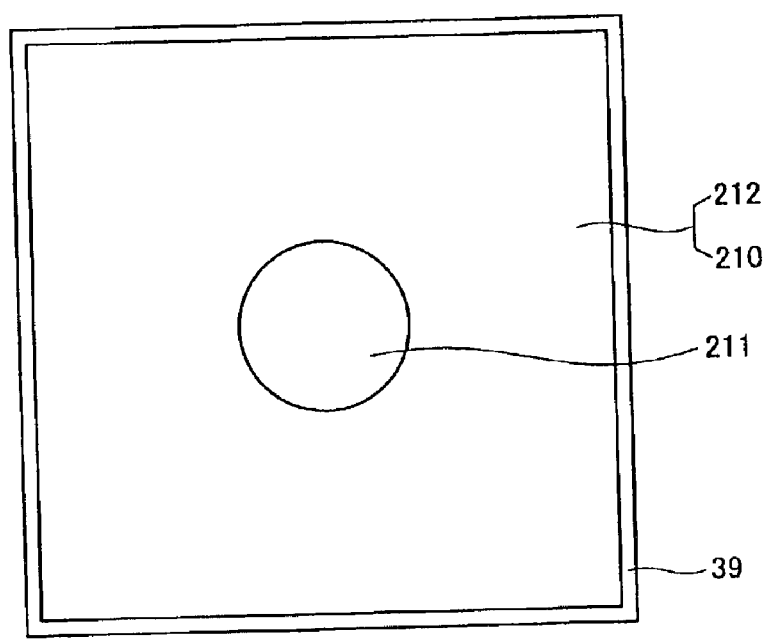
FIG. 7 is a schematic top view of the light emitting nitride-based compound semiconductor device of the third example.

FIG. 7 is a schematic top view of the light emitting nitride-based compound semiconductor device thus fabricated.

While in the third example p type ohmic electrode 210 has been formed of a Pd layer, it may be formed of any metal or alloy that allows a thin transparent film to be formed.

Furthermore, while in the third example transparent conductive film 212 has been formed of ITO, it may alternatively be formed of an oxide containing at least one selected from the group consisting of zinc (Zn), indium (In), tin (Sn), magnesium (Mg), cadmium (Cd), gallium (Ga) and lead (Pb).

Furthermore, while in the third example light emitting layer 37 has been a multiple quantum well formed of a barrier layer of GaN and a well layer of InGaN, it may be a single quantum well or it may be AlGaInN, GaNAs, GaNP or any quaternary or ternary mixed crystal.

Furthermore, while n type nitride-based compound semiconductor layer 33 has been of Si doped GaN, it may be formed for example of Si doped InGaN.

Furthermore, while ohmic electrode 34 has been formed by initially forming a Hf layer on a back surface of substrate 31 and then forming an Al layer thereon, it may be formed by initially forming an Al layer on the back surface of substrate 31 and then forming a Hf layer thereon.

Fourth Example

Figure 8:
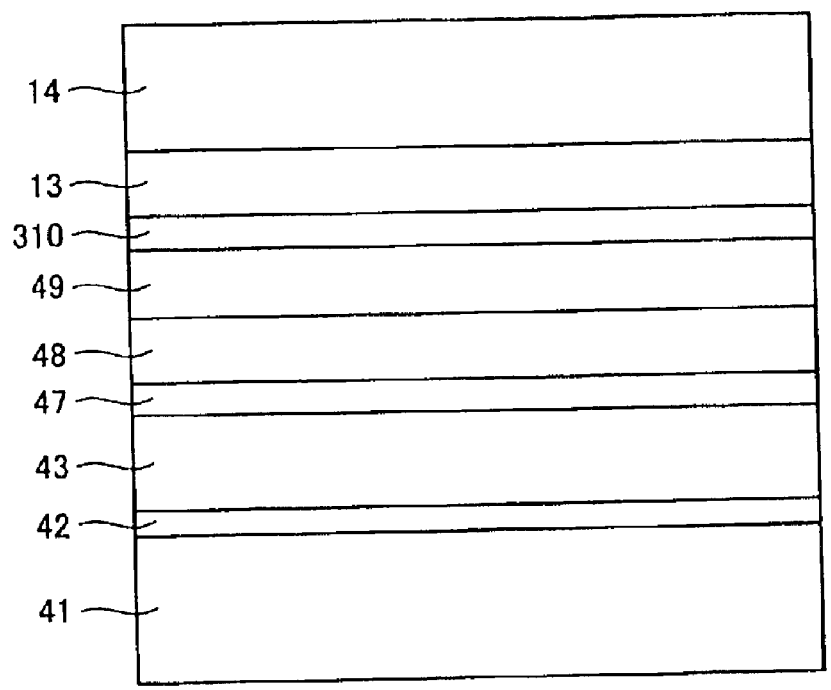
FIG. 8 is a schematic cross section of a light emitting nitride-based compound semiconductor device of a fourth example that is being fabricated.
Figure 9:
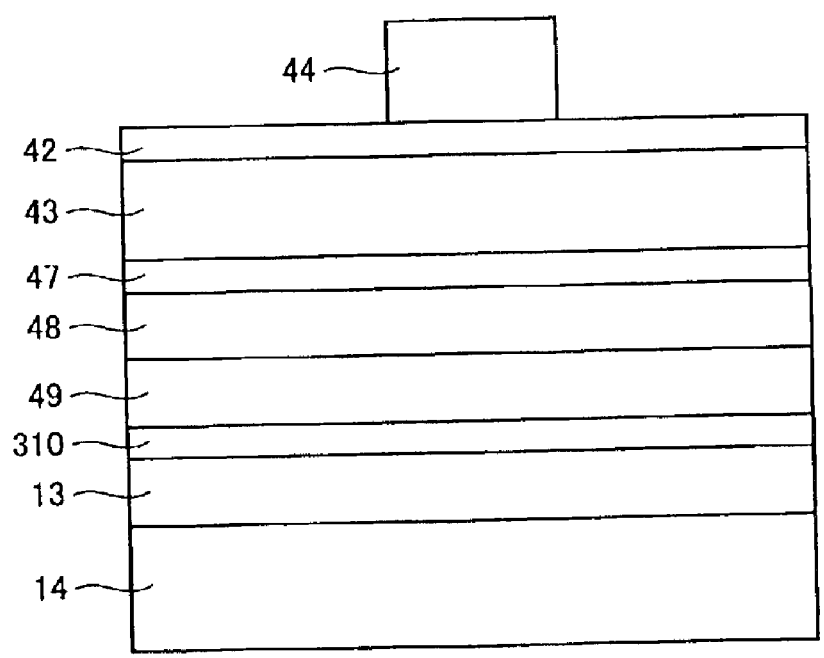
FIG. 9 is a schematic cross section of the light emitting nitride-based compound semiconductor device of the fourth example that is completed.

As shown in FIG. 8, an epitaxially grown wafer includes a substrate 41, a buffer layer 42, an n type nitride-based compound semiconductor layer 43, a light emitting layer 47, a p type clad layer 48, a p type contact layer 49, a p type ohmic electrode 310, a plating, underlying electrode 13 and a holding metal layer 14. As shown in FIG. 9, substrate 41 is then removed and an ohmic electrode 44 is formed on buffer layer 42 to complete a light emitting nitride-based compound semiconductor device.

The light emitting nitride-based compound semiconductor device of the fourth example is fabricated, as specifically described hereinafter.

Initially, as shown in FIG. 8, on Si substrate 41 n type buffer layer 42 of InAlN and n type nitride-based compound semiconductor layer 43 of Si doped GaN are formed in this order and thereon a multiple quantum well light emitting layer 47 is stacked, formed of a barrier layer of GaN and a well layer of InGaN. On light emitting layer 47 p type clad layer 48 is formed of p type AlGaN. On p type clad layer 48 p type contact layer 49 is formed of p type GaN. On a surface of p type contact layer 49 a Pd layer is provided by vapor deposition to form p type ohmic electrode 310 having a thickness of 10 nm and they are annealed in a vacuum at 500 degrees centigrade for three minutes to process the Pd layer and p type contact layer 49 to provide an alloy thereof. On p type ohmic electrode 310, an Au layer of 300 nm in thickness is provided by vapor deposition to form plating underlying electrode 13. On electrode 13, holding metal layer 14 formed of Ni and having a thickness of 100 μm is provided by electrolytic plating.

Substrate 41 is then removed. More specifically, a top surface of holding metal layer 14 and a side surface of the wafer excluding substrate 41 are covered with electron wax. Hydrofluoric acid, acetic acid and nitric acid are mixed together by a ratio of 5:2:2 and used as an etchant to dissolve and thus remove substrate 41 to expose a surface of buffer layer 42. The electron wax is removed with acetone or any other similar organic solvent.

Then, with reference to FIG. 9, on the surface of buffer layer 42 a 5 nm thick Hf layer and then a 200 nm thick Al layer are provided by vapor deposition and annealed in a vacuum at 500 degrees centigrade for three minutes to form ohmic electrode 44. Buffer layer 42 and ohmic electrode 44 has an interface with Hf and Al mixed together therearound and it has been found that a vicinity of the interface contains Hf of approximately 5% and Al of approximately 95% in amount.

Finally, the intermediate product is diced to have a size of 300 μm×300 μm.

While in the fourth example p type ohmic electrode 310 has been formed of Pd, it may be formed of any metal or alloy that can provide a p-layer ohmic electrode.

Furthermore, while in the fourth example, holding metal layer 14 is formed of Ni by electroless plating, it may be formed of any material that is conductive, and it may be formed by techniques other than vapor deposition and plating. For example it may be a simply stuck conductive plate.

Furthermore, while in the fourth example light emitting layer 47 has been a multiple quantum well formed of a barrier layer of GaN and a well layer of InGaN, it may be a single quantum well or it may be AlGaInN, GaNAs, GaNP or any quaternary or ternary mixed crystal.

Furthermore, while in the fourth example substrate 41 has been formed of Si, it may be any substrate that can be readily etched away and also allows a nitride-based compound semiconductor to be formed.

Furthermore, while semiconductor layer 43 has been of Si doped GaN, it may be formed for example of Si doped InGaN.

Furthermore, while ohmic electrode 44 has been formed by initially forming a Hf layer on buffer layer 42 and then forming an Al layer thereon, it may be formed by initially forming an Al layer on buffer layer 42 and then forming a Hf layer thereon.

Fifth Example

Figure 10:
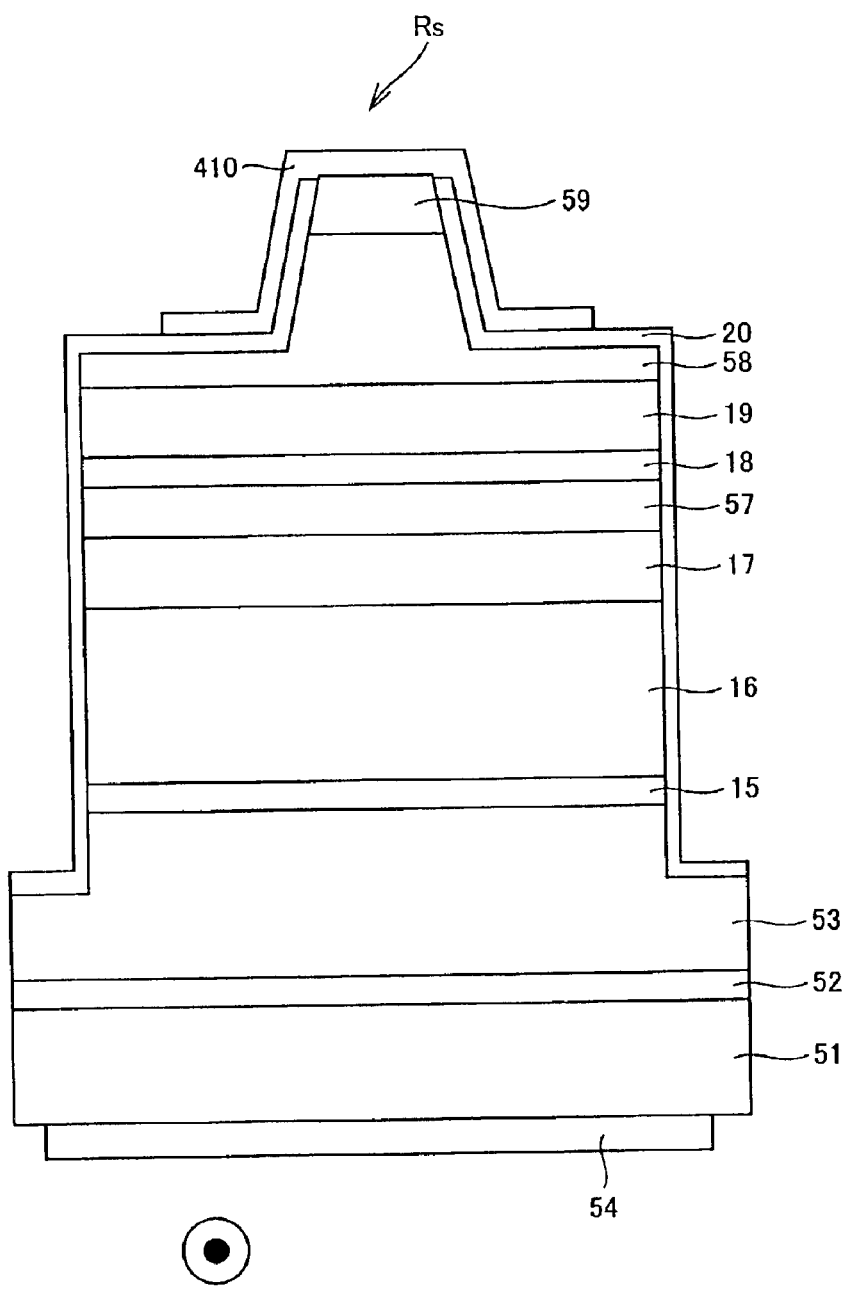
FIG. 10 is a schematic cross section of a nitride-based compound semiconductor laser device of a fifth example.

With reference to FIG. 10, a fifth example provides a nitride-based compound semiconductor laser device including an ohmic electrode 54, a substrate 51, a buffer layer 52, an n type nitride-based compound semiconductor layer 53, an n type crack prevention layer 15, an n type clad layer 16, an n type optical guide layer 17, a light emitting layer 57, a p type carrier block layer 18, a p type optical guide layer 19, a p type clad layer 58, a p type contact layer 59, a p type ohmic electrode 410 and a dielectric film 20.

The nitride-based compound semiconductor laser device using the ohmic electrode of the present invention is fabricated, as described hereinafter.

Initially on n type GaN substrate 51 GaN buffer layer 52 is formed at a low temperature to have a thickness of 100 nm. Then thereon n type GaN n type nitride-based compound semiconductor layer 53 is formed to have a thickness of 3 µm.

Subsequently, 40 nm-thick, $In_{0.07}Ga_{0.93}N$ n type crack prevention layer 15 is formed. Subsequently, 0.8 µm-thick, $Al_{0.1}Ga_{0.9}N$ n type clad layer 16 is formed. Subsequently, 0.1 µm-thick, GaN n type optical guide layer 17 is formed. Thereafter light emitting layer 57 is formed of three stacks of a 4 nm-thick, $GaN_{0.97}P_{0.03}$ well layer and a 8 nm-thick, $GaN_{0.99}P_{0.01}$ barrier layer.

Then on light emitting layer 57 20 nm-thick, $Al_{0.2}Ga_{0.8}N$ p type carrier block layer 18 is formed. Thereon 0.1 µm-thick, GaN p type optical guide layer 19 is formed. Thereon 0.5 µm-thick, $Al_{0.1}Ga_{0.9}N$ p type clad layer 58 is formed. Thereon 0.1 µm-thick, GaN p type contact layer 59 is formed.

While the above description has been provided in connection with C plane {0001} of GaN substrate 51, the orientation that serves as the substrate's main plane may be A plane {11–20}, R plane {1–102}, M plane {1–100} or the {1–101} plane. Furthermore it has been found that any substrates that have an offset angle within two degrees from the above orientation provide good surface morphology.

While in the above description substrate 51 has been formed of GaN, it may be a nitride-based compound semiconductor substrate other than GaN. For nitride-based compound semiconductor laser devices, to allow a vertical lateral mode to be unimodal it is preferable that a layer having a smaller index of refraction than a clad layer is adjacent to an outer side of the clad layer, and an AlGaN substrate is suitably used.

A process to obtain a nitride-based compound semiconductor laser device will now be described.

Ohmic electrode 54 is formed by vapor-depositing a Hf layer having a thickness of 5 nm on a back surface of substrate 51, thereafter vapor-depositing an Al layer having a thickness of 200 nm thereon, and then annealing the same in a vacuum at 500 degrees centigrade for three minutes.

Ohmic electrode 54 and the back surface of substrate 51 have an interface with Hf and Al mixed together therearound and it has been found that a vicinity of the interface contains Hf of approximately 3% and Al of approximately 97% in amount.

P type ohmic electrode 410 is etched in a stripe along nitride semiconductor crystallographic <1–100> direction to form a ridged stripe Rs. Ridged stripe Rs is formed to have a width of 2 µm. Thereafter, dielectric film 20 of $SiO_2$ is provided by vapor deposition. Thereafter, p type contact layer 59 is exposed. Thereafter on the exposed p type contact layer 59 and dielectric film 20, a Pd layer, then an Mo layer and then an Au layer are provided by vapor deposition to form p type ohmic electrode 410. Alternatively, p type ohmic electrode 410 may be Pd, Pt and Au layers vapor-deposited in order or it may be formed by providing a Pd layer and an Au layer on the Pd layer by vapor deposition or providing an Ni layer and an Au layer on the Ni layer by vapor deposition.

Finally, a cleavage plane of substrate 51 is utilized to provide a Fabry-Pérot resonator having a cavity length of 500 µm.

The Fabry-Pérot resonator is provided with a mirror end face, which is in turn provided with 70% reflectance, $SiO_2$ and $TiO_2$ dielectric films alternately by vapor deposition to provide a multi dielectric layer reflection film.

While in the fifth example in forming ohmic electrode 54 an electrode is formed at a back surface of substrate 51, it may be formed by using dry-etching to expose semiconductor layer 53 at a front side of an epitaxial wafer and forming ohmic electrode 54 on the exposed surface.

Furthermore, while ohmic electrode 54 has been formed by initially forming a Hf layer on a back surface of substrate 51 and then forming an Al layer thereon, it may be formed by initially forming an Al layer on an n-type substrate and then forming a Hf layer thereon.

Sixth Example

Figure 11:
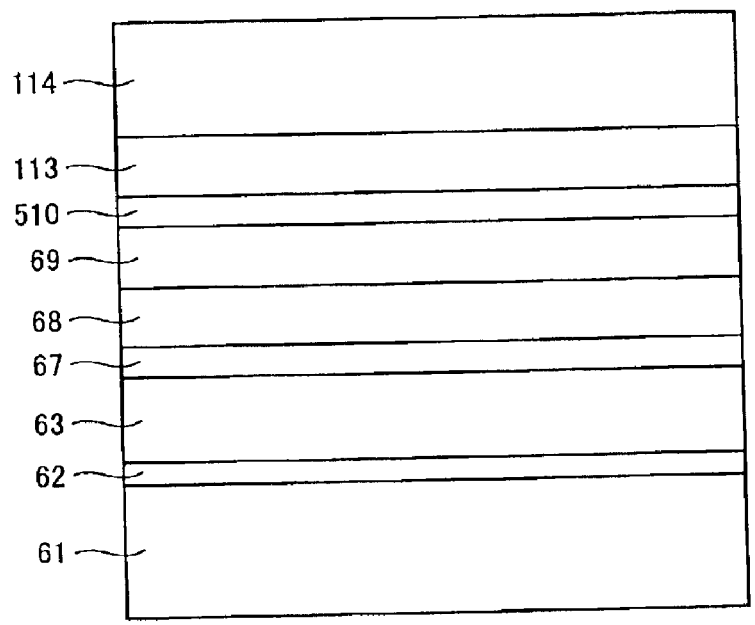
FIG. 11 is a schematic cross section of a light emitting nitride-based compound semiconductor device of a sixth example that is being fabricated.

As shown FIG. 11, an epitaxially grown wafer includes a substrate 61, a buffer layer 62, an n type nitride-based compound semiconductor layer 63, a light emitting layer 67, a p type clad layer 68, a p type contact layer 69, a p type ohmic electrode 510, a plating underlying electrode 113 and a holding metal layer 114. As shown FIG. 12, substrate 61 and buffer layer 62 are then removed and an ohmic electrode 64 is formed on n type nitride-based compound semiconductor layer 63 to complete a light emitting nitride-based compound semiconductor device.

The light emitting nitride-based compound semiconductor device of the sixth example is fabricated, as specifically described hereinafter.

Initially, as shown in FIG. 11, on Si substrate 61 n type buffer layer 62 of AlN and n type nitride-based compound semiconductor layer 63 of Si doped GaN in this order are formed and thereon a multiple quantum well light emitting layer 67 is stacked, formed of a barrier layer of GaN and a well layer of InGaN. On light emitting layer 67 p type clad layer 68 is formed of p type AlGaN. On p type clad layer 68 p type contact layer 69 is formed of p type GaN. On a surface of p type contact layer 69 a Pd layer is provided by vapor deposition to form p type ohmic electrode 510 having a thickness of 50 nm and they are annealed in a vacuum at 500 degrees centigrade for three minutes to process the Pd layer and p type contact layer 69 to provide an alloy thereof On p type ohmic electrode 510, an Au layer of 300 nm in thickness is provided by vapor deposition to form plating underlying electrode 113. On electrode 113, holding metal layer 114 formed of Ni and having a thickness of 100 µm is provided by electrolytic plating.

Substrate 61 is then removed. More specifically, a top surface of holding metal layer 114 and a side surface of the wafer excluding substrate 61 are covered with electron wax. Hydrofluoric acid, acetic acid and nitric acid are mixed together by a ratio of 5:2:2 and used as an etchant to dissolve and thus remove substrate 61 to expose a surface of buffer layer 62. The electron wax is removed with acetone or any other similar organic solvent.

Buffer layer 62 is then dry-etched away to expose a surface of semiconductor layer 63.

Figure 12:
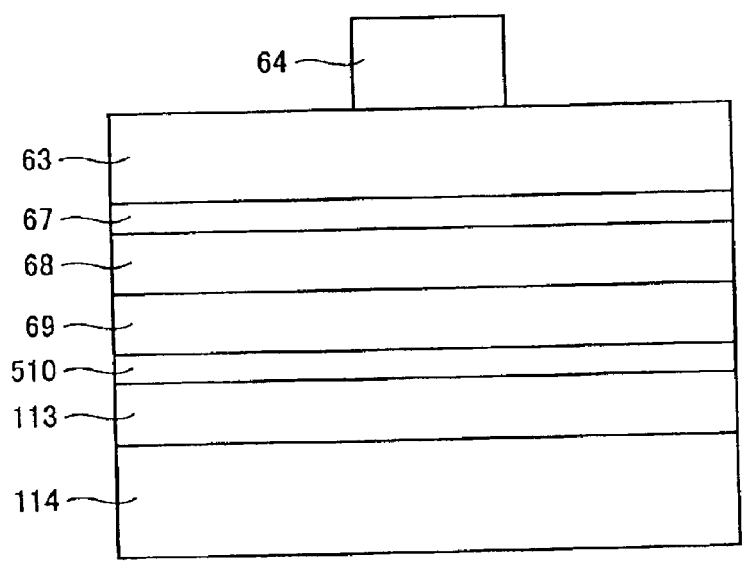
FIG. 12 is a schematic cross section of the light emitting nitride compound semiconductor device of the sixth example that is completed.

Then, as shown in FIG. 12, on a surface of semiconductor layer 63 a Hf layer and an Al layer are simultaneously formed to provide ohmic electrode 64 having a thickness of 300 nm. The Hf layer and the Al layer are annealed in a vacuum at 500 degrees centigrade for three minutes. Ohmic electrode 64 contains Hf and Al mixed together and it has been found that a vicinity of an interface between semiconductor layer 63 and ohmic electrode 64 contains Hf of approximately 5% and Al of approximately 95% in amount.

Finally, the intermediate product is diced to have a size of 300 µm×300 µm.

While in the sixth example p type ohmic electrode 510 has been formed of Pd, it may be formed of any metal or alloy that can provide a p-layer ohmic electrode.

Furthermore, while in the sixth example, holding metal layer 113 is formed of Ni by electroless plating, it may be formed of any material that is conductive, and it may be formed by techniques other than vapor deposition and plating. For example it may be a simply stuck conductive plate.

Furthermore, while in the sixth example light emitting layer 67 has been a multiple quantum well formed of a barrier layer of GaN and a well layer of InGaN, it may be a single quantum well or it may be AlGaInN, GaNAs, GaNP or any quaternary or ternary mixed crystal.

Furthermore, while in the sixth example substrate 61 has been formed of Si, it may be any substrate that can be readily etched away and also allows a nitride-based compound semiconductor to be formed.

Furthermore, while semiconductor layer 63 has been of Si doped GaN, it may be formed for example of Si doped InGaN.

In the present invention, as described above, an n type nitride-based compound semiconductor layer is not limited in material as long as it is formed of material represented by $In_xGa_yAl_{1-x-y}N$, wherein $0 \leq x \leq 1$, $0 \leq y \leq 1$, and $x+y \leq 1$. Furthermore, the n type nitride-based compound semiconductor layer is stacked by a conventionally known technique, e.g., vapor-phase epitaxy, molecular beam epitaxy or the like.

Furthermore, the n type nitride-based compound semiconductor layer of the present invention, as described above, and an ohmic electrode formed thereon that have an interface with Hf and Al mixed together therearound, may have the interface with the Hf and Al mixed with an additional metal therearound.

Furthermore, the present ohmic electrode can also be provided on the n type nitride-based compound semiconductor layer by sputtering, vacuum deposition, chemical vapor deposition, electron beam vapor deposition or any other similar, conventionally known technique, or a combination thereof.

Furthermore, while annealing is performed after a Hf layer is formed on the n type nitride-based compound semiconductor layer and an Al layer is provided thereon, it can alternatively be performed by heating the semiconductor layer when the Hf layer and the Al layer are formed.

Furthermore, a metal or alloy layer other than a Hf layer and an Al layer can also be provided on the n type nitride-based compound semiconductor layer.

As is apparent from the above description, the present invention can provide an ohmic electrode providing excellent contact with nitride based compound semiconductor. The present invention can thus provide high production yields of low voltage driven and highly reliable light emitting nitride based compound semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an ohmic electrode, the method comprising:

forming a hafnium layer on a surface of an n type nitride-based compound semiconductor layer to have a thickness of 1 to 15 nm;

forming an aluminum layer on the hafnium layer and; and annealing the hafnium layer and the aluminum layer to form a layer formed of hafnium and aluminum mixed together, so that after said annealing the layer formed comprising hafnium and aluminum mixed together has an Hf content from 0.001 to 50% in a vicinity of an interface between the nitride-based compound semiconductor layer and the layer formed comprising hafnium and aluminum mixed together.

2. The method of claim 1, wherein the ohmic electrode is an electrode of a light emitting diode.

3. The method of claim 1, wherein the ohmic electrode is an electrode of a light emitting nitride-based compound semiconductor device.

\* \* \* \* \*